United States Patent
Jain et al.

(10) Patent No.: US 7,139,448 B2
(45) Date of Patent: Nov. 21, 2006

(54) PHOTONIC-ELECTRONIC CIRCUIT BOARDS

(75) Inventors: Kanti Jain, Hawthorne, NY (US); Carl C. Kling, Hawthorne, NY (US)

(73) Assignee: Anvik Corporation, Hawthorne, NY (US)

( * ) Notice: Subject to any disclaimer, the term of this patent is extended or adjusted under 35 U.S.C. 154(b) by 216 days.

(21) Appl. No.: 10/718,223

(22) Filed: Nov. 20, 2003

(65) Prior Publication Data
US 2005/0111781 A1      May 26, 2005

(51) Int. Cl.
*G02B 6/12*     (2006.01)
*G03G 15/00*   (2006.01)

(52) U.S. Cl. .................. 385/14; 385/129; 385/130; 385/131; 385/132; 430/54; 430/56; 430/57.1

(58) Field of Classification Search ............ 385/14, 385/129, 130, 131, 132, 49; 430/54, 56, 430/57.1
See application file for complete search history.

(56) References Cited

U.S. PATENT DOCUMENTS 4,878,728 A * 11/1989 Mannschke ............. 385/14
5,140,149 A * 8/1992 Sakata et al. ............. 257/436
5,511,142 A * 4/1996 Horie et al. .............. 385/129
6,724,968 B1 * 4/2004 Lackritz et al. .......... 385/131

* cited by examiner

*Primary Examiner*—Brian M. Healy
(74) *Attorney, Agent, or Firm*—Carl C. Kling

(57) ABSTRACT

Significant advances in semiconductor microelectronics technologies have resulted in greatly enhanced chip performance. Systems studies have continuously shown that on-board interconnects between chips are the bottleneck in achieving board level performance that is comparable with this chip performance. This invention provides a multiple-layer photonic-electronic circuit board family that solves this interconnect performance problem. Multiple layers of patterned optical channel waveguides and patterned electrical conductors co-exist in a single circuit board structure, with optical vias to transport light between different photonics layers and electrical vias to transport electrical signals and power between different electronics layers. An all-lithographic fabrication technology is used to build the entire board structure with mutually compatible planar processing steps. Novel techniques are used to produce channel optical waveguides connected to in-plane 45 degree turning mirrors and channel optical waveguides connected to optical vias with out-of-plane 45 degree turning mirrors. The mirrors can have either total internal reflection or metallized facets.

27 Claims, 10 Drawing Sheets

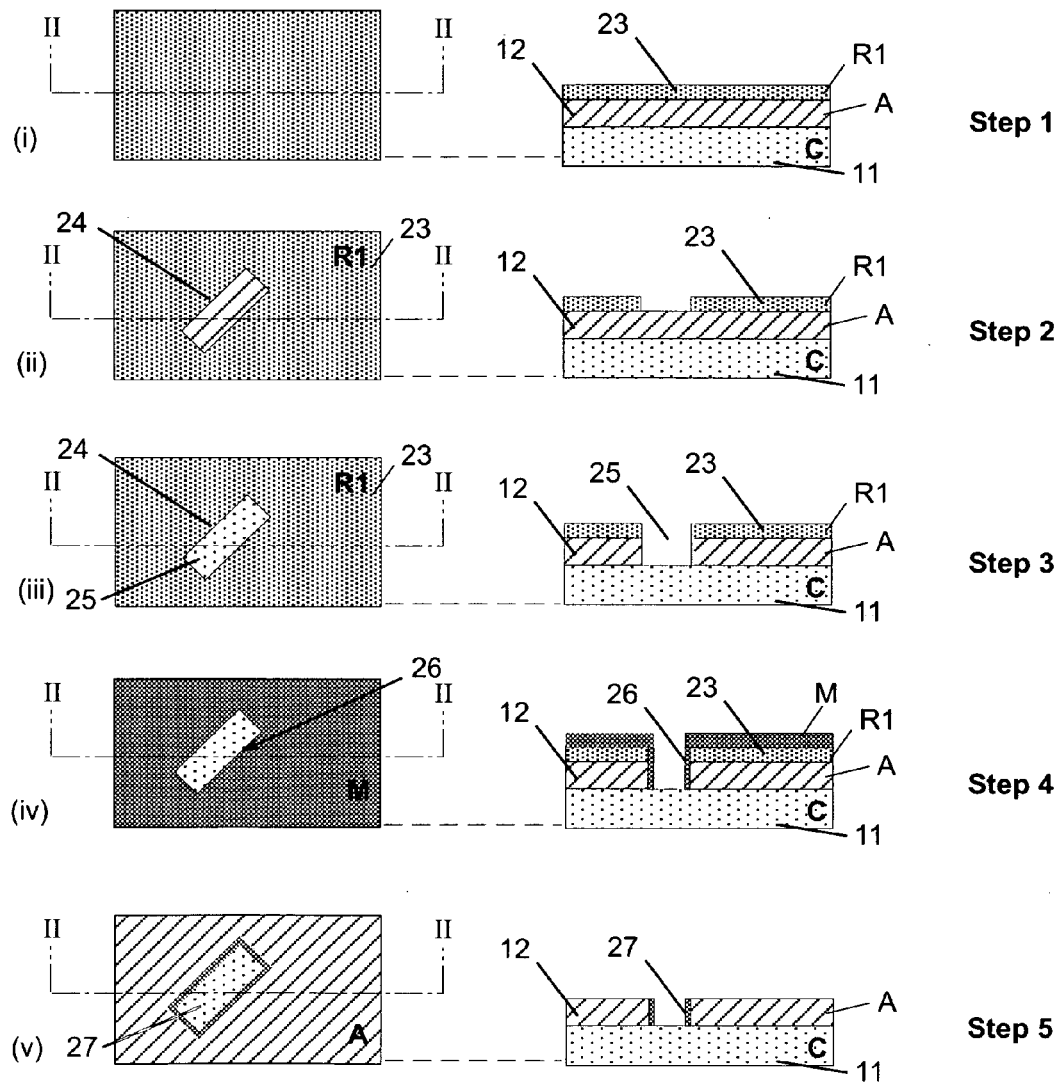
Figure 4 (i-v)

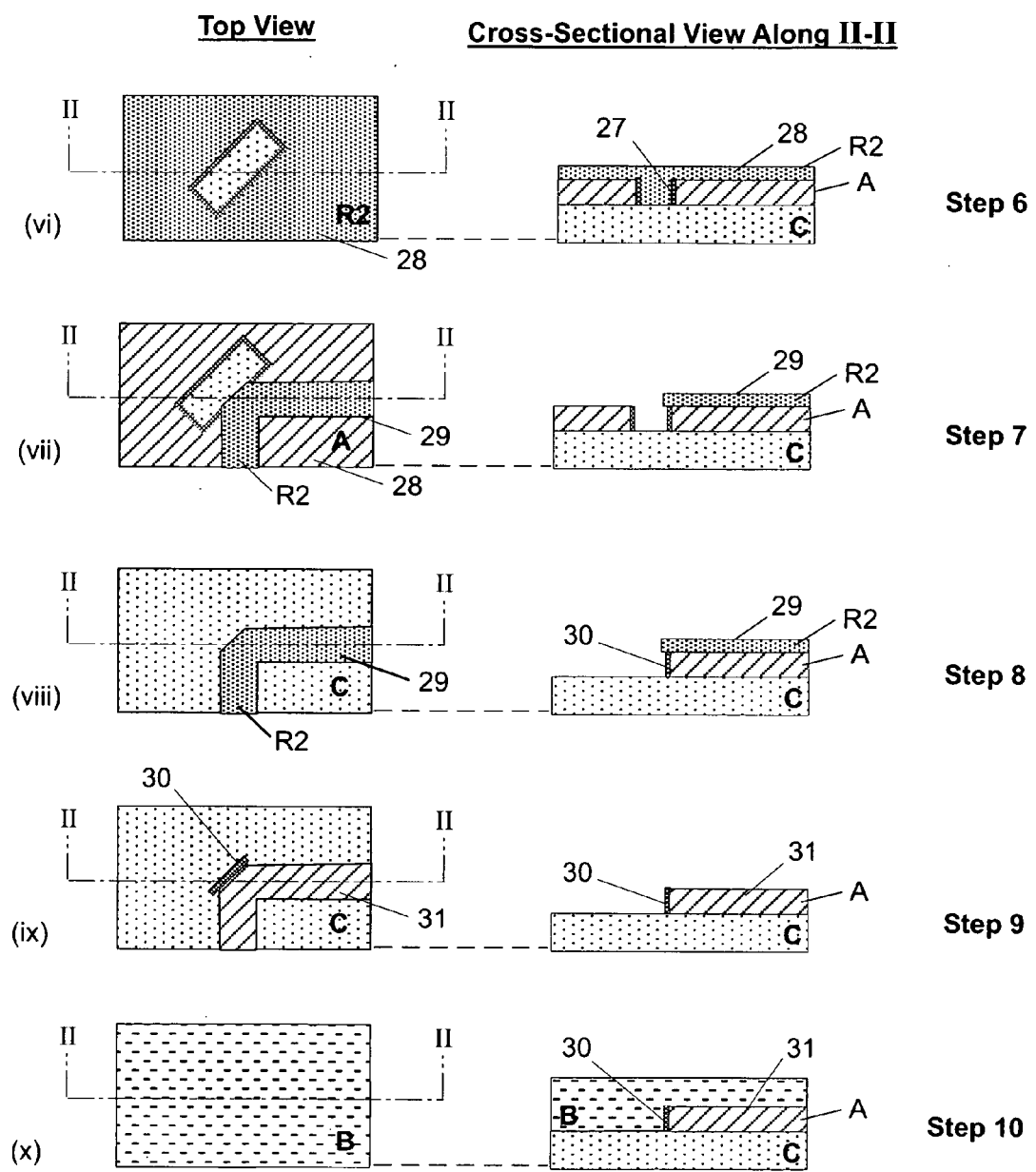
Figure 4 (vi-x)

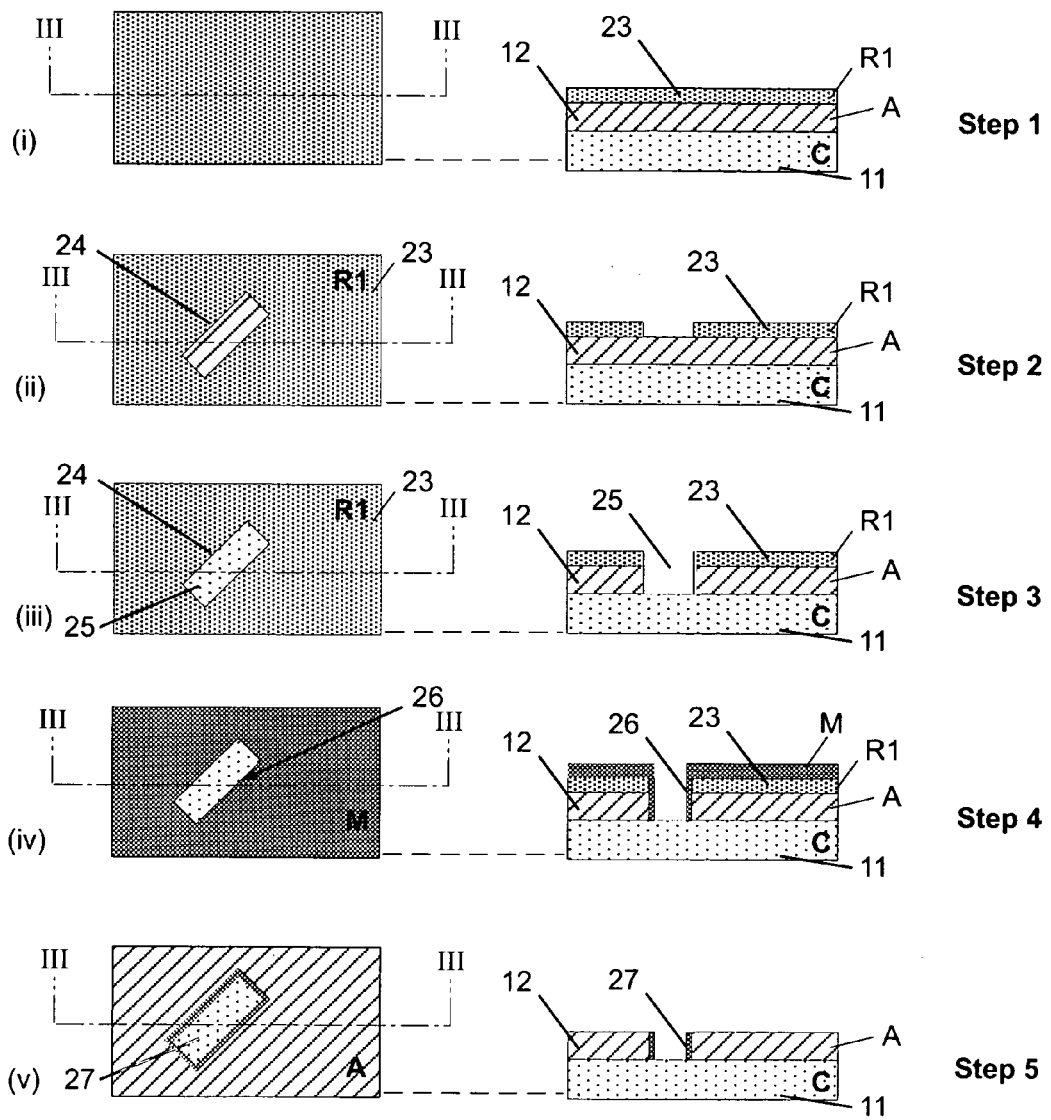
Figure 5 (i-v)

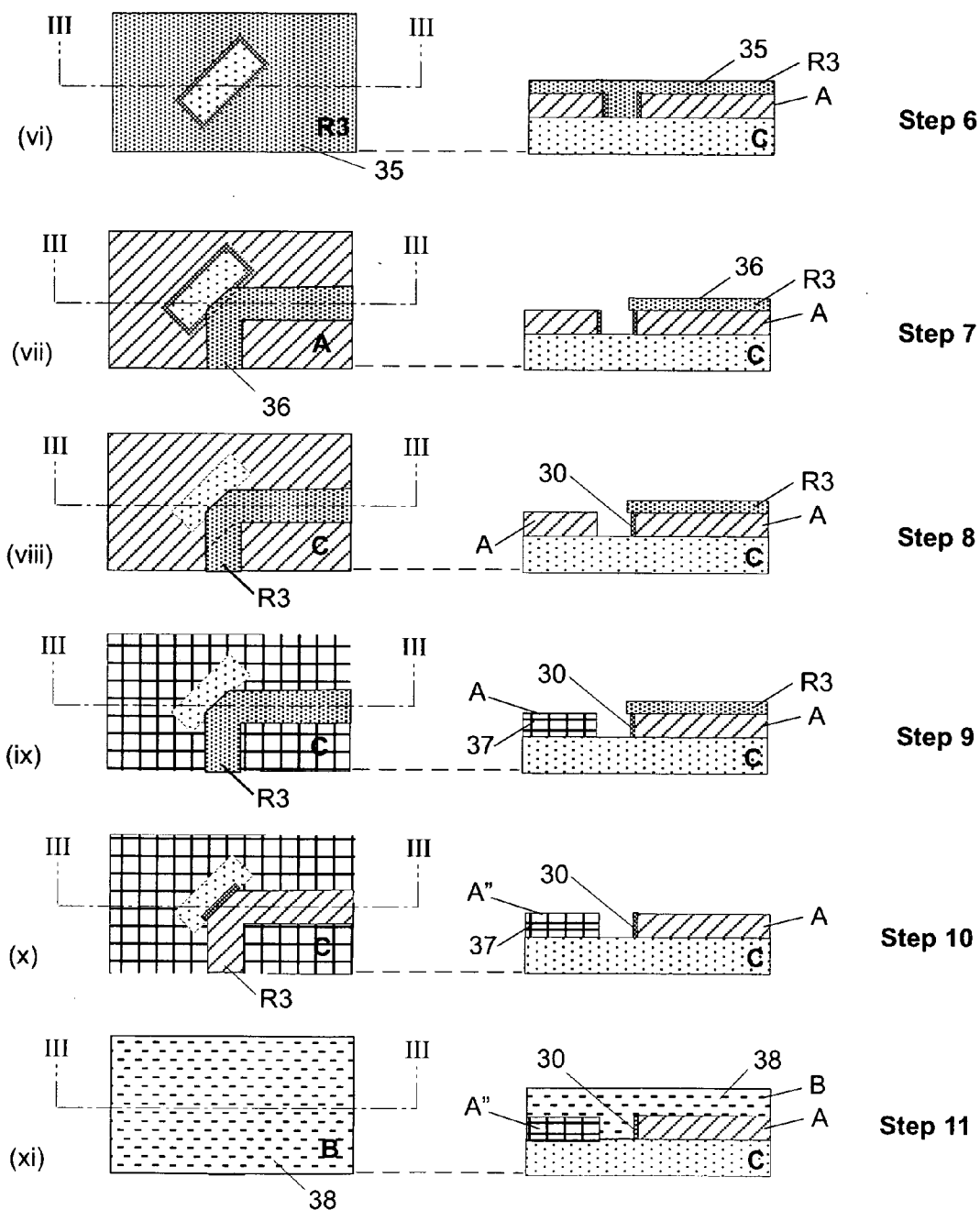
Figure 5 (vi-xi)

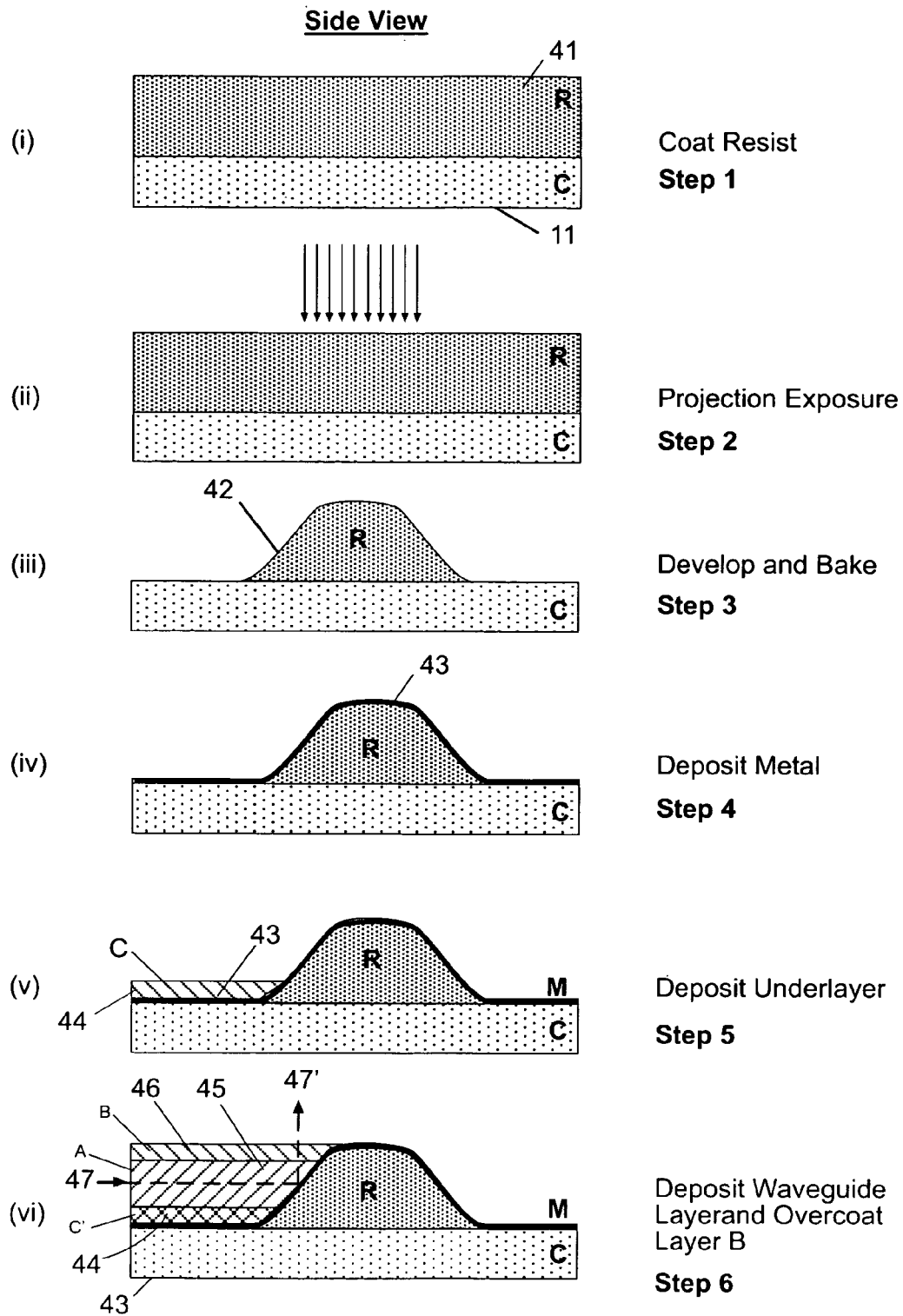
Figure 6 (i-vi)

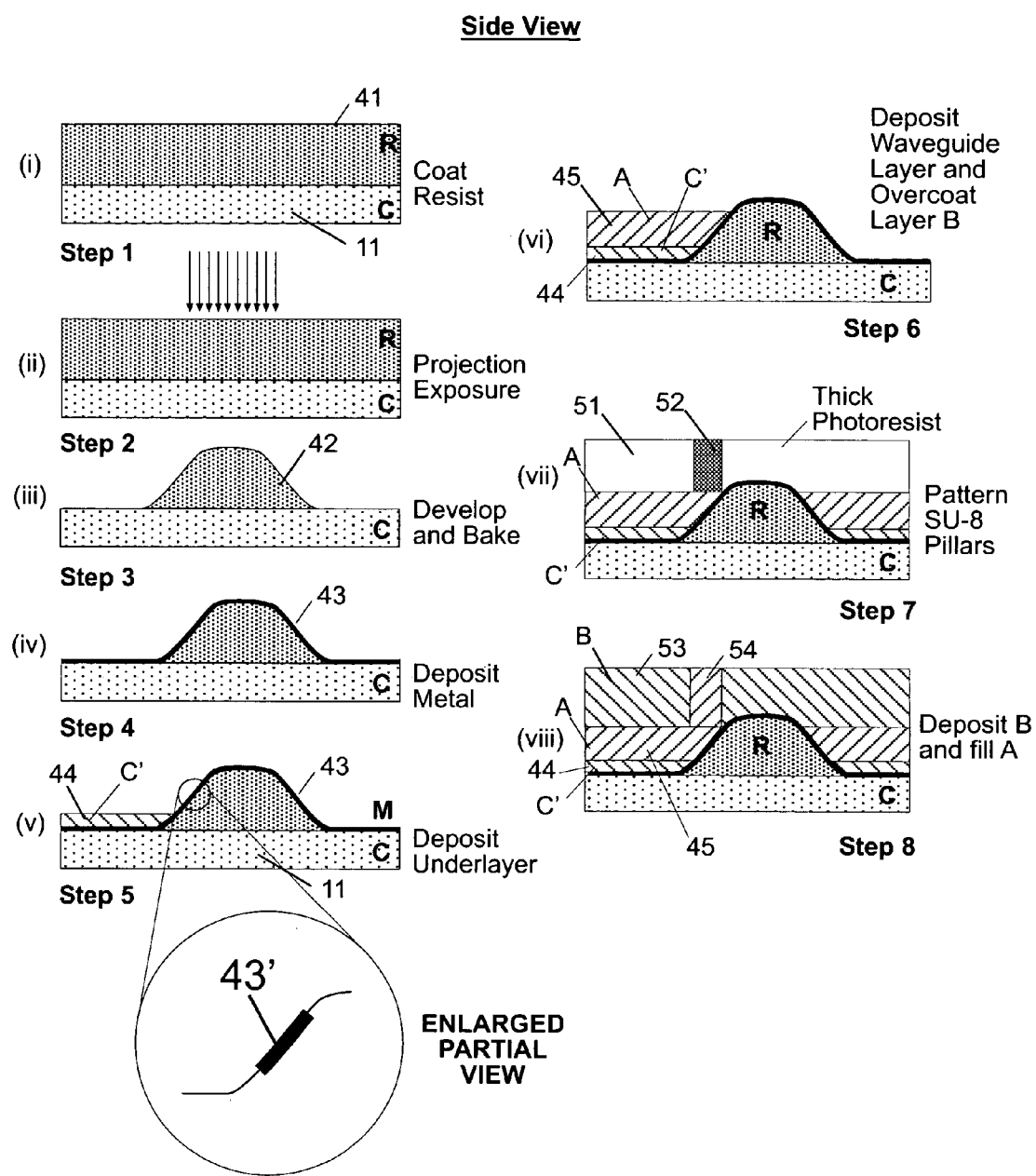
Figure 7 (i-viii)

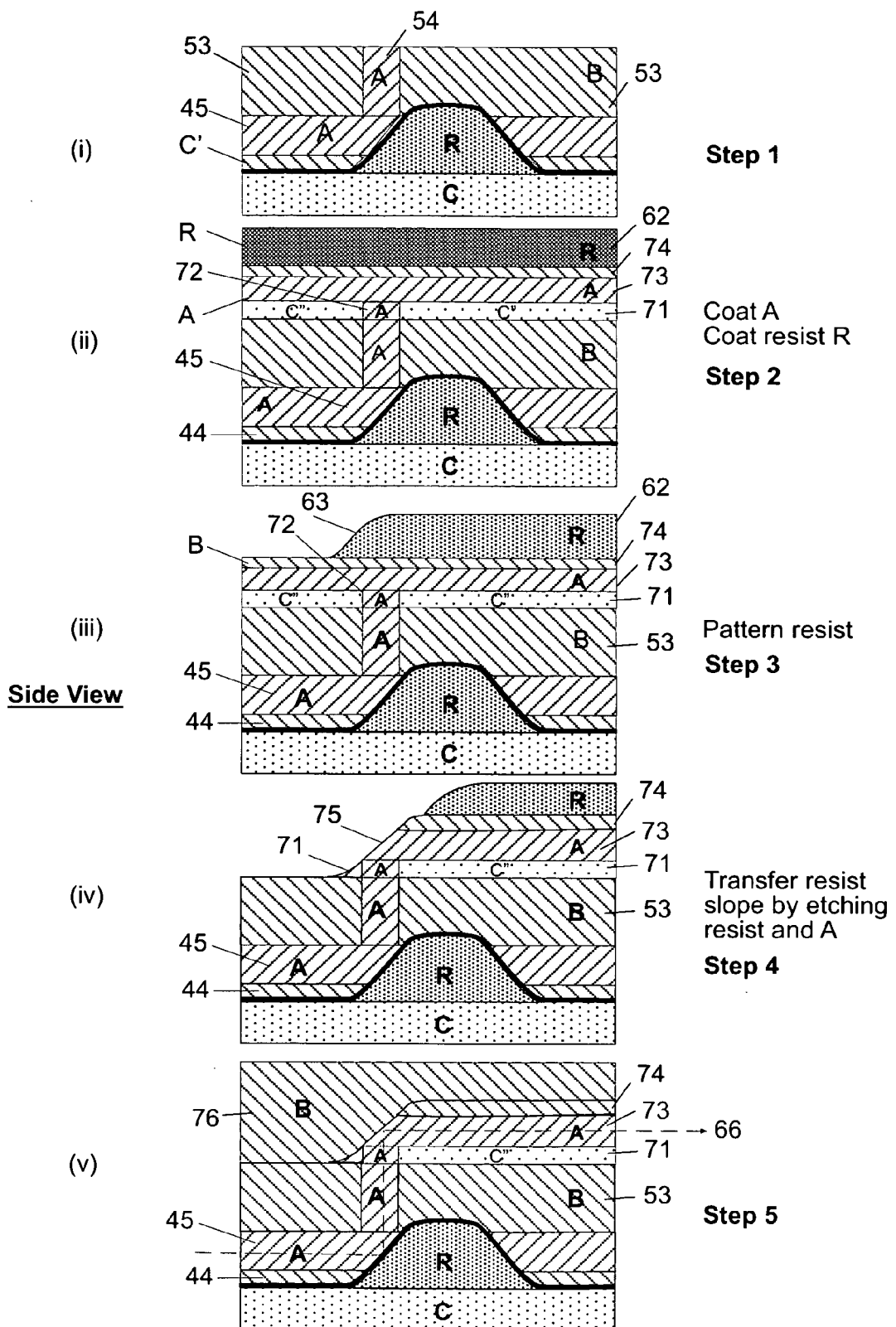
Figure 8 (i-v)

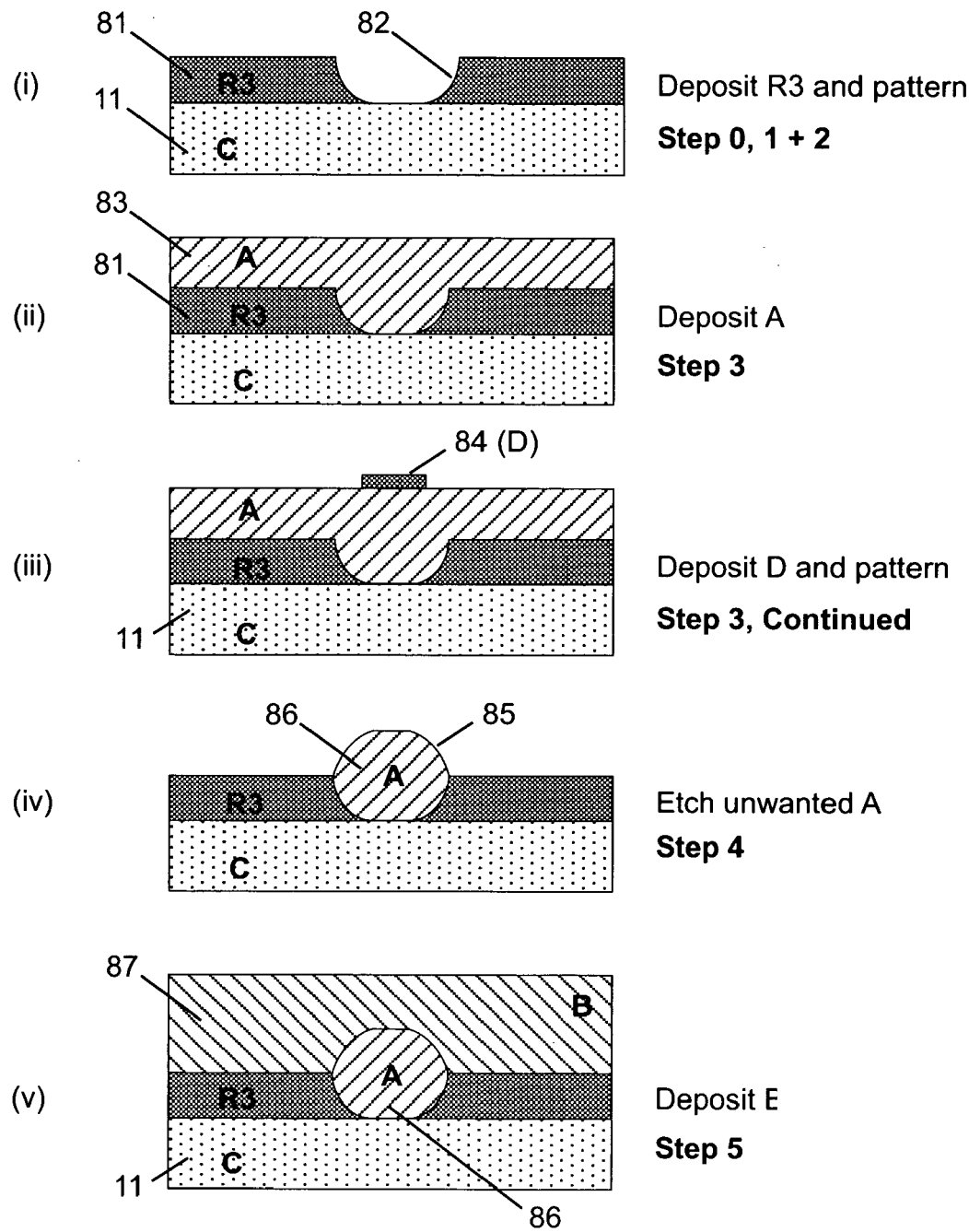
Figure 9 (i-v)

PHOTONIC-ELECTRONIC CIRCUIT BOARDS

BACKGROUND OF THE INVENTION

1. Field of the Invention

This invention relates to a solid-state multiple-layer photonic-electronic circuit board package family, having interconnected layers of photonic circuitry and electronic circuitry.

2. Description of Related Art

Significant advances in the last two decades in semiconductor microelectronics technologies have resulted in memory chip capacities exceeding one Gigabyte and logic chip speeds exceeding one GigaHertz. Systems studies have continuously shown that on-board interconnects between chips are the bottleneck in achieving a board-level performance that is comparable to the intra-chip data rates. As minimum feature sizes fall below 100 nm, the clock rates of leading-edge microprocessors are expected to exceed 10 GHz in the next few years, further emphasizing the need for faster chip-to-chip interconnects. It is well recognized that a doubling of transistor density in a chip increases the on-board interconnect complexity by a factor greater than two. The ever-increasing complexity of the devices is also leading to the need for a larger number of interconnect layers.

Photonic data transmission between chips is a potential solution to this fundamental problem of on-board interconnect complexity, but several technological hurdles have prevented implementation of this approach. These include the co-existence of multiple photonic and electronic layers in a single circuit board, optical vias to transport light between different photonics layers, and an all-lithographic fabrication technology that can use mutually compatible planar processing steps to build the entire circuit board. This patent application addresses these key barriers through innovative fabrication processes, materials, and photonic devices. This address enables integration of very high-density optical interconnect structures in a low-profile, planar format to achieve the goal of realizing cost-effective, high-performance photonic printed circuit boards.

Two major photonic interconnect approaches exist for next generation data transmission needs: free-space, and embedded, planar interconnects. The free-space approach uses VCSELs (vertical cavity surface emitting lasers) to direct signals out of the board towards micro-optics (such as micro-lenses, micromirrors, and gratings), which then redirect the signals. These micro-optical components must protrude 10 to 20 mm above the surface of the circuit board in order to send and receive light in a plane parallel to the board surface. This approach has the potential to increase the data rate significantly because it eliminates cross-talk and allows use of 2D channel arrays. Another advantage is that the interconnect scheme is reconfigurable, i.e., the communication between processors can be reprogrammed according to the specific task at hand by redirecting the laser signals. The major disadvantages of this approach are that it requires extremely tight alignment tolerances for the placement of the micro-optical components, the thickness of the board is very large (tens of mm), and it is sensitive to vibration, contamination, and other environmental effects.

Several organizations have conducted research in embedded photonic interconnect techniques that overcome many of the above-stated problems. For example, technology has been developed for embedding fixed-position micromirrors in waveguide layers in order to redirect a guided beam from horizontal to vertical, or to achieve a bend in the horizontal plane. One approach is based on a slow, multistep, silicon-wafer-based process, which includes for example, chemical mechanical polishing, a step which would likely be far too time consuming for a mass-produced item. Another approach is based on an embossing technique, which, in addition to being quite time consuming to produce, lacks both resolution and alignment precision.

While these technologies have the potential to overcome the limitations of the free-space method, the fabrication processes are not suitable for high-throughput production. In addition to the throughput and alignment challenges mentioned here, other key challenges that must be addressed are transmission and coupling losses as well as the, currently, low levels of integration.

Efforts to improve the fabrication process for photonic interconnects have included a demonstration of a hybrid electrical-optical circuit board (EOCB) using a hot embossing technique to fabricate an optical foil and then laminating this foil into a PCB. This technique, while inexpensive, does not yield smooth channel walls and is difficult to implement on large, non-planar substrates. Other work has developed photonic backplanes using a hybrid approach, employing laser diodes and discrete components such as micro-lenses to send signals to a backplanes that has embedded polymer waveguides. Prototypes having data rates of 1 Gb/s across distances of less than 100 cm have been successfully tested.

Guided by the lessons learned from integrated circuit technology, it is likely that the best solution to the optical interconnect challenge is an all-lithographic planar fabrication process. New patternable polymer materials have recently been developed that exhibit excellent transparency over a large wavelength range and offer the potential to achieve very high level of optical integration, at high throughputs and with high resolution.

A primary barrier to the realization of high-speed optical chip-to-chip interconnection has been the numerous optical signal losses that plague present transmission, insertion, and coupling techniques. These losses have arisen due to lack of process technologies that enable high-yield fabrication of the required devices in the desired configurations and relative orientations. In the case of waveguide structures, high-speed, single-mode (or even multi-mode) waveguides have not been manufactured for runs of large distances due to, for example, the scattering losses that arise from the stitching of the waveguide structures. In the current state of planar photonic interconnect technology, the overall level of integration is low, the number of discrete components used is high, and the alignment precision is poor. Furthermore, the sizes of integrated elements are coarse and the number of integrated optical elements is low. As a result, achievable data rates as well as channel densities have been limited.

Compared to this prior art, this invention provides a platform of manufacturing processes that enables the fabrication of novel photonic interconnect structures leading to high-density, heterogeneous integration of photonic and electronic devices. This invention will enable the design and manufacture of photonically interconnected systems transmitting data at speeds of at least 10 GHz (extendable to >50 GHz) with channel densities of at least 16 channels/mm (extendable to >100 channels/mm) over distances of at least 300 mm (extendable to >1 m). Such systems, in a multilayer planar format, provide a low-profile interconnect structure (<25 mm thick, extendable to <10 mm). Fabrication of such systems can be achieved on large areas (>1000 cm2), at high throughputs (up to 4 sq. ft./min.), and on a variety of substrates (including flexible materials).

These photonic interconnect structures may include long planar waveguides, splitters, embedded 45° mirrors, and optical vias (connecting two photonic layers), among others. These photonic interconnect structures are fabricated by lithography, photoablation, or image-wise refractive index modulation using large-area, high-resolution, seamless patterning technologies. The materials for these structures may be polymer-based, hybrid materials, nanocomposites, and self-assembled structures.

The result is alignment-tolerant fabrication of integrated, photonic circuit optical layers on large-area boards and/or flexible substrates.

BACKGROUND TECHNOLOGY

Importance of Photonic-Electronic Circuit Boards

The effective data communication speed in a complex, multi-rack electronic system fundamentally depends on three distinct regimes of the system hardware architecture: the intra-chip communication regime, the chip-to-chip interconnect regime on a single circuit board, the circuit board to circuit board regime using backplanes, and the between-racks data transport regime. While the enormous technological advances made in recent years have enabled on-chip clock rates of leading-edge microprocessors to approach 10 GHz and data rates of multiple terabits/sec are expected to be achieved between different electronic shelves in the next few years, the data communication speed between different chips on a board has not kept pace with this progress. It is well recognized that a doubling of transistor density in a chip increases the on-board interconnect complexity by a factor greater than two. The ever-increasing complexity of the devices is also leading to the need for a larger number of interconnect layers. Photonic data transmission between chips is a potential solution to this fundamental problem, but several technological hurdles have prevented implementation of this approach.

Challenges for Fabrication of Photonic-Electronic Circuit Boards

A primary barrier to the realization of high-speed photonic chip-to-chip interconnection has been the numerous losses that plague current transmission, insertion, and coupling techniques. These losses have arisen due to lack of process technologies that enable fabrication of the required devices in the desired configurations and relative orientations. In the case of waveguide structures, high-speed, single-mode (or even multi-mode) waveguides have not been manufactured for large distance runs due to, for example, the scattering losses that arise from the stitching of the waveguide structures. In the current state of planar photonic interconnect technology, the overall level of integration is low, the optical signal losses are too high, the number of discrete components used is high, and the alignment precision is poor. Furthermore, the sizes of integrated elements are coarse and the number of integrated photonic elements is low. As a result, achievable data rates as well as channel densities have been limited. There is thus a great motivation to develop a process platform that will (a) enable the fabrication of novel photonic interconnect structures that can co-exist with conducting electronic layers in a planar, multi-layer, low-profile format, and (b) demonstrate the feasibility of manufacturing such boards in large areas at high throughput and low cost.

Optical coupling and insertion losses arise mainly from the poor alignment of the photonic module placement on the board structure and the layer-to-layer alignment of board itself. The alignment problem is compounded by the fact that in the course of manufacturing the large, often flexible, substrates used for conventional printed circuits, the dimensional instability of the base substrate can often lead to pattern placement errors that cannot be corrected through conventional alignment technology. Contact printing has been used to fabricate large-area boards, but this process is incapable of generating fine alignment because the mask and substrate can be moved relative to each other only when they are apart. The subsequent motion to bring them into contact and pulling of vacuum leads to the frequent misalignment. Alternatively, steppers can deliver fine alignment performance, but over limited areas. Finally, direct-write techniques have been used to deliver fine resolution and alignment over large areas, including the implementation of scale corrections for substrate dimensional instability, but such techniques are limited in throughput due to the serial, pixel-by-pixel patterning speed.

Benefits of Photonics

New manufacturing processes and materials enable the fabrication of novel photonic interconnect structures leading to high-density, heterogeneous integration of photonic and electronic devices. These photonic interconnect structures must co-exist with the electronic interconnect structures in the board. These new technologies, novel materials, and integrated high-speed photonic and electronic elements enable the design and manufacture of interconnected systems which can transmit data at very high speeds. Such speeds can be of at least 10 GHz (extendable to >50 GHz) with channel densities of at least 16 channels/mm (extendable to >100 channels/mm) over distances of at least 300 mm (extendable to >1 m). Such systems can be developed in a multilayer, planar format that provides a low-profile interconnect structure (<25 mm thick, extendable to <10 mm). Fabrication of such systems can be achieved on large areas (>1000 cm2), at high throughputs (up to 4 sq. ft./min.), and on a variety of substrates (including flexible materials). Through the use of the innovative large-area lithography technology with anamorphic scale compensation that Anvik has developed, it will be possible to make major reductions in transmission and coupling losses as a result of the ability to deliver seamless, micron-level resolution over large areas with high-precision alignment between the features in the different photonic and electronic layers. In addition, through the incorporation of the high-power excimer laser, this technology delivers the above performance with high processing throughput. Finally, the system has a modular design, which permits multiple system configurations and upgradability of the systems as products migrate from one generation to the next.

The Photonic-Electronic Circuit Board Concept

A conceptual illustration of a photonic-electronic circuit board for computing applications is shown in FIG. 1. An array 4 of laser diode sources provides the optical radiation that travels through multiple layers of optical planar waveguides 2. The photonic-electronic circuit board also contains patterned layers of electrical conductors 3 that are capable of routing electrical signals from and to electronic circuitry chips 92 and transporting electrical power from power circuitry chips 91. The photonic-electronic circuit board can communicate externally by photonic means through photonic transceiver chips 6 and can receive image and other photonic information through detector arrays 7. Photonic signals are transported vertically from one waveguide layer to another waveguide layer using optical vias 8. These optical vias are also used to couple light from the laser diode sources to the waveguide layers and to couple light from the waveguide layer to the photonic transceiver and detector array chips. Conducting metal vias are used to couple electrical signals and electrical power vertically to the electronics chips.

Problem areas proliferate in how to fabricate the low-loss, low-crosstalk micro-optic interconnections. Such problem areas include:

- low-loss total internal reflection (TIR) waveguide sharp bends
- low-loss mirror waveguide sharp bends
- refractive index modulation
- out-of-plane redirection optics
- optical vias
- optical via-connected waveguides in adjacent layers
- optimized cross-section for fiber optic terminals.

Photonic Interconnect Elements

The preferred technology for fabricating a variety of photonic interconnect elements in large-area structures is planar but non-rigid, and incorporates polymeric materials as well as composites. The technology uses novel processing techniques and systems that Anvik has developed for micron-level patterning on large-area substrates, and eliminates the dependence on silicon-wafer-based (or similar) fabrication approaches which are not cost-effective, and coarse mechanical approaches, e.g., embossing, which are deficient in both resolution and alignment precision necessary for achieving high interconnect densities. The photonic interconnect devices include single mode and multimode waveguides, splitters, taps, sharp bends, in-plane and out-of-plane 45° mirrors, gratings, and mode converters.

Sharp double bends in the waveguides are produced by fabricating 'in-plane' reflecting 45° facets in closely spaced pairs. The facets in this patent application operate by typical waveguiding techniques or by means of a mirror coating. This invention provides new techniques to form optical vias in conjunction with 'out-of-plane' 45° mirrors to allow light signals to be sent between two layers and from a layer to a photonic transceiver socket.

BRIEF SUMMARY OF THE INVENTION

This invention combines high-speed batch imaging with self-masked deposition of waveguide runs and facets of optical transmission patterns operating by dual-material total internal reflection (TIR), and by reflecting facets and transmissive runs in a complex micro-optical waveguide. A feature of the invention is a simple self-masked deposition method for both optical runs and optical facets, both operating by TIR or metallized mirror layers. A conceptual illustration of the demonstration chip-to-chip optical interconnect platform operating with in-plane waveguide patterns is shown in FIG. 1. The invention will be discussed as a photonic circuit platform fabricated as a non-rigid curved board. A conventional rigid board is also possible. Photonic transceiver connectors may interface existing silicon integrated circuit packages with the optical signals on the photonic circuit board. Moreover, the photonic transceiver connectors typically have solder ball pads for electrical connections with the silicon devices. Each photonic signal pad (not power or ground) will have an associated modulated light source (for output) or a light detector (for data input). Metal vias will be fabricated to connect the power and ground pads in each integrated circuit (IC) to the main board power/ground connectors.

There are a multiplicity of optical layers in which waveguides and other optical structures are fabricated. Optical (and electronic) interconnect structures, including waveguides, splitters, bends, and vias, are used where required. Other processing techniques, such as photoablation, image-wise refractive index modulation, and photobleaching, are also available for patterning. Optical interconnect elements are described in this patent application; power and ground connections are lightly referenced, as are electronic signal connections which may be conventional. Sharp bends are realized by fabricating in-plane and out-of-plane facets. Optical vias transmit signals from various sources, between layers, or to detectors, and are described in detail along with methods of fabrication. A conceptual illustration of the use of optical vias in a photonic-electronic circuit board is shown in FIG. 2. The polymers or other materials to be used for these optical layers and their processing may be conventional, or may be special to the use, but are background for this invention. The requirement is an effective, economical technology for forming in-plane waveguide patterns of runs and facets as well as out-of-plane facets and vias.

Other objects, features and advantages of the invention will be apparent from the following written description, claims, abstract, and the annexed drawings.

BRIEF DESCRIPTION OF THE SEVERAL VIEWS OF THE DRAWING

FIG. 4 is a stylized process flow diagram of the invention, in plan and in cross section, for developing a channel waveguide. It has a run and a 90-degree turn in-plane, using a metallized facet. It is formed using a well and a deposited metallized mirror surface.

FIG. 5 is a stylized process flow diagram of the invention in plan and in cross section, for developing a channel waveguide having a run and a 90-degree turn in-plane using a metallized facet formed using a well and a deposited metallized mirror surface, and using photobleaching to produce a channel waveguide.

FIG. 6 is a stylized side elevation process flow diagram for producing a channel waveguide with a metallized facet that couples light vertically out of the plane of the waveguide, illustrating how the rounding anomaly at the base of the nonlinear mirror slope can be bypassed with an underlayer.

FIG. 7 is a stylized side elevation process flow diagram for producing an optical via consisting of a channel waveguide with a metallized facet that couples light vertically out of the plane of the waveguide into another waveguide that is vertically oriented.

FIG. 8 is a stylized side elevation process flow diagram for producing another type of optical via; consisting of a first and second channel waveguides, a vertical waveguide, and first and second metallized facets. This accomplishes efficient transfer of light from one planar optical waveguide layer to another vertically displaced optical waveguide layer.

FIG. 9 is a stylized process flow diagram for an in-plane connection of waveguide to optical fiber, with the waveguide rounded to match the roundness of the optical fiber.

DETAILED DESCRIPTION OF THE INVENTION

Figure 1:
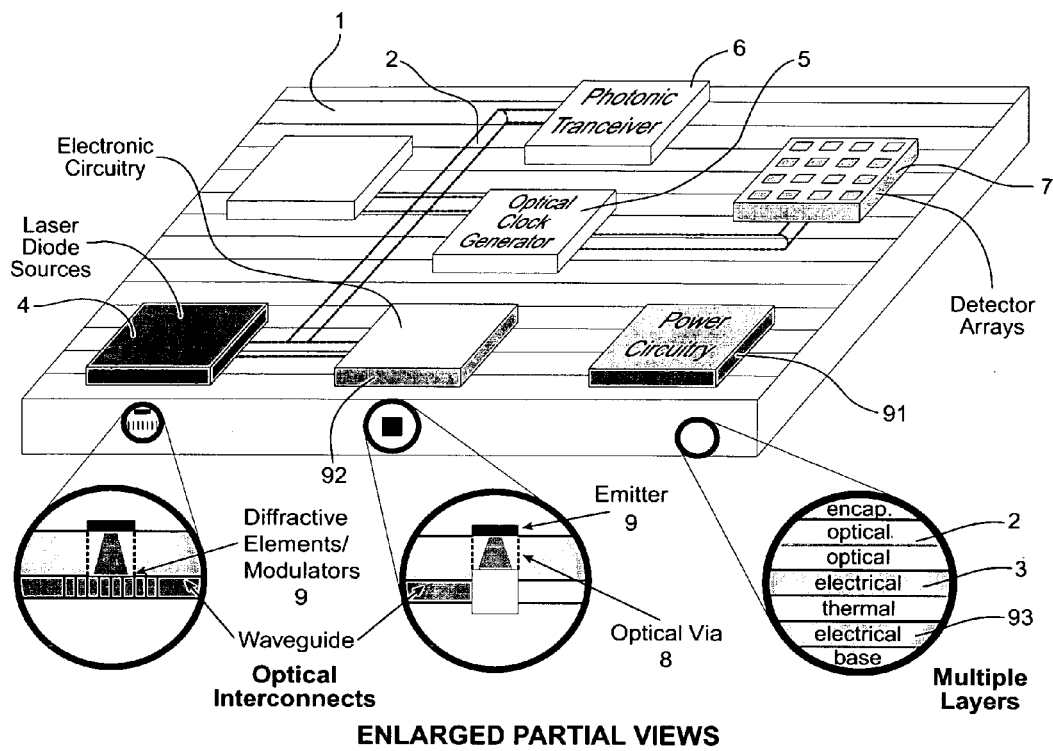
FIG. 1 is a stylized depiction of a system-on-board photonic-electronic device, implemented as a high-speed, large-area, photonic-electronic multi-layer printed circuit board accommodating a subsystem or an entire system of electronic and photonic subsystems, plus interconnections with and without optoelectronic transducers, and extra connections on interconnected chips.

FIG. 1 represents a photonic-electronic printed circuit board (PCB) system, showing a substrate base 1 and carrying optical waveguides 2 which form multi-planar light paths. There are multiple optical and electronic layers as shown in the insets, including vias, out-of-plane mirror elements, and optical chips 4, 5, 6 and 7. Additional items having optical significance are in-plane bends, optical vias 8, which connect the various layers optically, and optical elements 9, which may include diffractive elements, modulators, and emitters. Electronic vias connect the various layers electronically. Still more items having optical significance may include passive layers 10 such as a planarizing layer (not shown in FIG. 1, but shown in FIG. 2) and certain spacing layers or partial layers. Optical interconnects may include active elements such as diffractive elements, modulators, or emitters, as shown in the insets. There typically also are power chips 91 and electronic circuitry 92 in layers such as layer 93.

All-optical systems are conceptualized, but practicalities currently suggest a mixed photonic-electronic system, in which the photonics are primarily signal interconnections. The system may have electronic interconnect layers and electronic signal circuitry, primarily intra-chip, with both photonic and electronic inter-chip signal connection vias and with an electronic power grid. Attempts at hybrid photonic-electronic circuit packages have not fully exploited the manufacturability similarities of photonics or electronics, and therefore are not economically feasible at this time.

This patent application concerns a method of fabricating in-plane waveguide runs and in-plane waveguide facets, using refractive techniques as well as various mirror techniques. It uses extra-layer connection techniques for joining chips to transfer connectives. Connectives include electronic connectives such as printed circuits and wires, and optical connectives such as optical fibers. There is also available a broad range of optical, optoelectronic and electronic transducers and repeater amplifiers. In many situations the actual construction of such devices is not critical, but in this patent application certain critical juxtapositions are discussed. The electronic elements and connectives must co-exist and even co-operate, without interference, with the photonic elements and connectives. Because there is a much greater body of prior art in multi-layer electronics, this patent application will concentrate on optical connectives, typically referred to as waveguides (sometimes waveguide) of various types, including optical vias and connectors, and on optical transmission elements such as optical fibers and deposited or etched waveguides and turning mirrors. There will be a need also for various transfer elements between photonics and electronics. Such transfer elements are typically detectors, generators and transponders.

Figure 2:
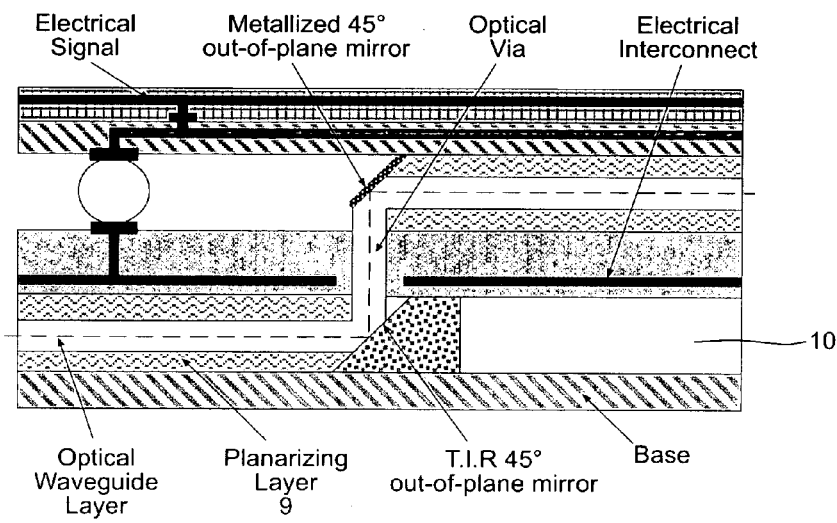
FIG. 2 is a side elevation view of a cross-section of a simplified multi-layer photonic-electronic device according to the invention.

FIG. 2 is a cross section of a photonic-electronic system of several layers, of which one or more layers can be made, at least partially, by inter-plane bends such as the optical via 8 as shown in the inset of FIG. 1, or by similar intra-plane bends.

There still may be a need for gaps in the solid-state photonic package or in the solid-state photonic-electronic package. There may be an inter-layer gap for assembly requirements, or to position a solder ball or other three-dimensional connection. There may be a need for cooling air or liquid coolant. The photonic-electronic package family of this patent application can easily handle these intra-layer gaps, but care must be taken at photonic waveguide interfaces with air gaps, because the transition from waveguide refractive index to air gap refractive index may be a source of undesirable total internal reflection.

In addition, an intra-plane gap may be desired for optical process-related reasons, although in most cases the gap need not be an air gap, but may be simply the need to have a layer of extra thickness. If desired, gap-filling inert, even opaque, plastic may be employed, or gap-filling spacers may be placed.

The reason for the occasional extra-thick layer is to accommodate a manufacturing detail of optical via mirror production—rounded anomalies top and bottom in a fabricated 45° mirror. The rounded anomalies at the bottom are simply submerged by a very small extra depth of the mirror slope, and the rounded anomalies at the top are simply bypassed. The rounded bottom anomalies are covered up by an underlayer and, if necessary, an overlayer, leaving a 45° mirror of the proper slant height to fold the optical beam 90-degrees without using the inappropriately curved top or bottom of the mirror surface.

Figure 3:
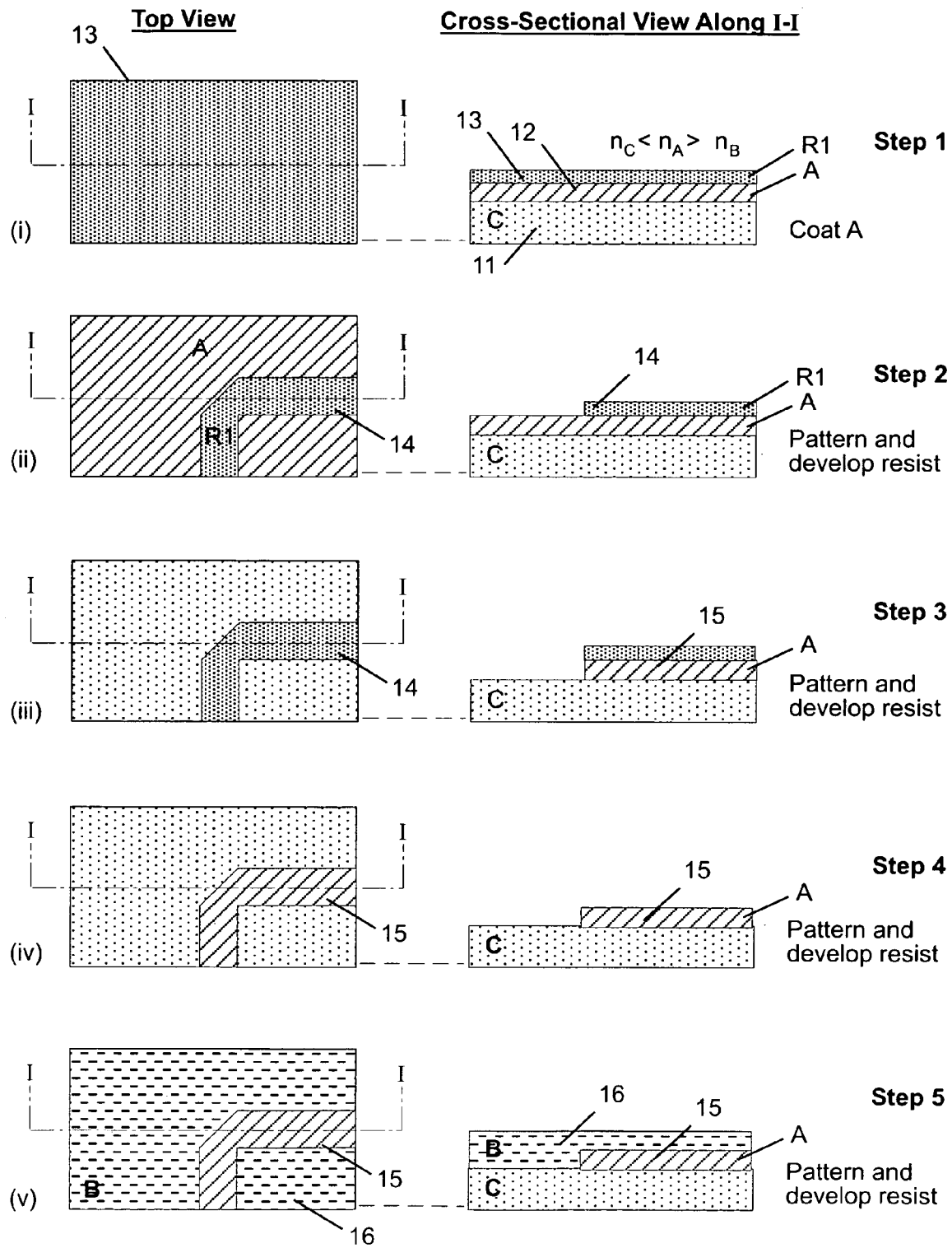
FIG. 3 is a stylized process flow diagram of the invention, in plan and in cross section for developing a channel waveguide having a run and an in-plane 90-degree bend accomplished using a TIR facet.

FIG. 3 is an illustrated composite chart showing the process sequence step-by-step, with results of each step shown in plan and cross section, for making intra-plane total internal reflection turning mirrors in channel optical waveguides. An underlayer of material C, identified as layer 11 in the cross section views, has deposited upon it the material A (12, configured, after patterning as bent waveguide 15). The turn is typically a 90° fold of the light beam by a 45° facet, with completion as a ridge waveguide shown in FIG. 3(iv) and completion as a channel waveguide shown in FIG. 3(v) after covering with overcoat material B (16). While a 90° turn is preferred for most applications, other fold angles are possible. The core of the waveguide is composed of material A. In the case of the ridge waveguide, the cladding material is air on the top and sides of the guide and material C on the bottom. In the case of the channel waveguide, the cladding material is material B 16 on the top and sides of the guide and material C 11 on the bottom. For multimode waveguides, typical waveguide core heights and widths range from 10 to 65 microns. For single mode waveguides, typical waveguide heights core and widths range from 1 to 5 microns. For bound waveguide modes to exist, the indices of refraction of the waveguide materials must be chosen so that $n_C < n_A > n_B$.

The turning mirrors made by this process operate by total internal reflection. For high optical efficiency, a large difference in the index of refraction between the core material A and the cladding material in the vicinity of the mirror facet is required. For a 90° turn, it is required that $n_A > 1.414 \times n_{cladding}$. This is readily achieved for most core materials in the case of ridge waveguides where $n_{cladding} = 1$, but is difficult to achieve in a channel waveguide, where $n_{cladding}$ is on the order of 1.5 and $n_A > 2.1$ would be required.

FIG. 4 is an illustrated chart showing the process sequence step-by-step, with results of each step shown in plan and cross section, for making intra-plane metal turning mirrors in otherwise unmetallized optical channel waveguides. The turn is typically a 90° fold of the light beam by a 45° facet, with completion as a ridge waveguide shown in FIG. 4(ix) and completion as a channel waveguide shown in FIG. 4(x) after covering with overcoat material B. While a 90° turn is preferred for most applications, other fold angles are possible.

The waveguide core is again composed of material A and the cladding materials are again either air or material B or material C. Completion as a ridge waveguide is shown in FIG. 4(ix) and completion as a channel waveguide is shown in 4(x). Typical core waveguide dimensions are the same as for FIG. 3. Again, for good waveguiding, the indices of refraction must be chosen so that $n_C < n_A > n_B$.

In contrast to the process of FIG. 3, this process has the advantage that the turning mirrors made by this process operate with high optical efficiency over a wide range of values of the indices of refraction of the waveguide core and cladding layers. This makes it possible to choose from a wider range of potential core and cladding materials than in the case of FIG. 3 above. Also, the necessary positive differential in index of refraction between the waveguide core and the cladding layers can be reduced to 1% or less, making it possible to use processes such as photobleaching to define the waveguides.

FIG. 5 is an illustrated chart showing the process sequence step-by-step, with results of each step shown in plan and cross section, for making intra-plane channel optical waveguides with metal turning mirrors that provide 90° fold of the light beam by 45° facets, using photobleaching to define the waveguides. As shown in FIG. 5(x), the photobleaching radiation transforms material A into material A" with index of refraction $n_{A''}$ reduced from its former value $n_A$. Layers and items 24, 26, 27, 35, 36, 37 and 38 will be further discussed later during discussion of the process steps. This provides lateral confinement of the waveguide mode. Only channel waveguides can be produced by this process. Typical core waveguide dimensions are the same as for FIG. 3. Completion as a channel waveguide is shown in FIG. 5(xi) after covering with overcoat material B (38). The overall condition of good waveguiding is that that $n_C < n_A > n_B$, $n_{A''}$. As in the process shown in FIG. 4, the turning mirrors made by this process operate with high optical efficiency over a wide range of values of the indices of refraction of the waveguide core and cladding layers. While a 90° turn is preferred for most applications, other fold angles are possible.

FIG. 6 is an illustrated chart showing the process sequence step-by-step, with results of each step shown in side elevation, for making an optical channel waveguide with a single 45° metallized reflecting facet that couples light vertically out of the waveguide at a 90° angle out of the plane of the waveguide It is envisioned that there will be adjacent layers and that an adjacent layer may be a pass-through layer or may be a receiving layer, but there is no provision for pass-through or reception shown in this figure.

As shown in FIG. 6(vi), the light beam 47 propagating in channel waveguide 45 is reflected in the vertical direction by the metallized facet to form beam 47' that propagates normal to the plane of the waveguide. Typical waveguide core dimensions are the same as given in the case of FIG. 3. Index of refraction requirements for the various materials are the same as given in the case of FIG. 4. For the type of device shown in FIG. 6, the vertically directed light is not yet contained in a waveguide and will spread laterally by diffraction as it propagates. However, the directionality and locality of the light coupled out of the waveguide is sufficient for efficient coupling to large photonic devices such as wide area, slow photodetectors or large multimode waveguide structures. This type of device is directly useful for certain types of photonic-electronic circuit boards where the top layer is an optical waveguide layer. It is also useful as a building block for the optical via devices to be described in FIGS. 7 and 8.

FIG. 6 shows how a flat turning mirror may be finessed from a doubly-rounded slope of a pillar 42 holding a mirror layer 43. Typically, after exposure and developing, photoresist pillars such as 42 have a central flat portion, with a rounded portion at top and another rounded portion at bottom. The finesse is simply not to use the rounded portions; to bury the bottom rounded portion under an underlayer 44 and to avoid using, or to bury, the top rounded portion. FIG. 6(vi) shows both top and bottom rounded portions buried. Mirror layer 43 may, if desired, be trimmed by etching or laser ablation to eliminate undesired reflections at the curved top and bottom where reflections are undesirable. See inset, FIG. 7, showing discontinuous mirror layer 43'.

FIG. 7 is an illustrated chart showing the process sequence step-by-step, with results of each step shown in side elevation. This process sequence makes a type of optical via consisting of optical channel waveguides with a single 45° metallized reflecting facet that couples light vertically out of the waveguide. The coupling is at a 90° angle out of the plane of the waveguide into another waveguide (not shown in FIG. 7) that is vertically oriented. This vertically oriented waveguide serves to conduct the light into or through any adjacent layer, for further use or pass-through. As shown in 7(viii), light propagating in channel waveguide 45 is reflected in the vertical direction by the metallized facet into vertically oriented waveguide 54. In this illustration, both waveguides have core material composed of material A. However, different core materials could be used. Typical waveguide core dimensions are the same as given in the case of FIG. 3. Index of refraction requirements for the various materials are the same as given in the case of FIG. 4. For this type of optical via, in contrast to the case of FIG. 6, the vertically directed light is contained in a waveguide and can be further conducted through numerous adjacent pass-through layers (not shown in FIG. 7) without any spreading due to diffraction. These pass-through layers can be photonic or electronic. In further contrast to FIG. 6, the light can now be efficiently coupled to small photonic devices such as fast photodetectors or to other waveguide structures that have the same core dimensions as the original waveguide. This type of optical via is useful for coupling light into or out of a buried optical waveguide layer in a multi-layer circuit package.

As discussed above with respect to FIG. 6, FIG. 7 shows how the reflecting facet is trimmed by the underlayer C' (44) and by the overcoat layer B (53) extending slightly downslope on pillar 42 mirrorization 43.

FIG. 8 is an illustrated chart showing the process sequence step-by-step, with results of each step shown in side elevation, for making another type of optical via that accomplishes efficient transfer of light from one planar optical waveguide layer to another vertically displaced optical waveguide layer. It consists of a first optical channel waveguide in the first planar waveguide layer with a first 45° metallized reflecting facet that couples light vertically out of the waveguide at a 90° angle out of the plane of the waveguide into another waveguide that is vertically oriented with a second 45° metallized reflecting facet that couples light at a 90° angle out of the vertical waveguide into a second optical channel waveguide in the second optical waveguide layer. This vertically oriented waveguide serves to conduct the light through adjacent pass-through layers. These pass-through layers can be either photonic or electronic.

As shown in FIG. 8(v), light propagating in channel waveguide 45 in the first waveguide layer is reflected in the vertical direction by the first metallized facet into vertically oriented waveguide 54. Layers 44 and 53 cooperate in the process. Portions of all but photoresist layer 62 remain after the processing. A second metallized facet 75 then reflects the light into the second channel waveguide 73 in the second waveguide layer. In this illustration, all waveguides have core material composed of material A. However, different core materials could be used for each wavguide. Typical waveguide core dimensions are the same as given in the case of FIG. 3. Index of refraction requirements for the various materials are the same as given for FIG. 4.

For this type of optical via, as in the case of FIG. 7, the vertically directed light is contained in a waveguide and can be conducted through numerous adjacent pass-through layers without any spreading due to diffraction. These pass-through layers can be photonic or electronic. However, in contrast to the case of FIG. 7, the light is then efficiently coupled into a second channel waveguide in a second vertically displace waveguide layer. This type of optical via is a key enabling element for the operation of a multi-layer photonic-electronic circuit board with multiple optical waveguide layers.

FIG. 9 is a composite schematic chart of the result of process flow to demonstrate rounded multi-mode waveguide fabrication with optimized coupling to optical fibers. The important feature of FIG. 9 is that the completed waveguide 86 made of material A, is rounded so as to present a low-loss butt joint to a round optical fiber (not shown in FIG. 9).

The process starts with the usual base layer 11 of material C, with a layer 81 of durable photoresist material R3 already configured with an etched channel 82 having rounded sides. Layer 83 of material A is applied in FIG. 9(ii).

Pattern 84 is applied in FIG. 9(iii) to delineate the curved waveguide.

FIG. 9(iv) shows the result of etching away the unwanted portions of layer 83 of material A—see FIG. 9(iii)—to leave a curved waveguide 85 for joining of its face 86 to a blunt optical fiber of similar cylinder (not shown).

FIG. 9(v) shows completion as a channel waveguide 86 of rounded configuration, channelized by layer 87 material B and layer 11 of material C.

The method of preparation of the rounded connections of FIG. 9 is as follows:

Steps 0, 1 & 2—Substrate. Underlayer C & Waveguide Layer A

Step 0 Provide a suitable substrate.

Step 1. Provide a deposited base layer 11. This deposited base layer 11 typically is an underlayer C (such as polycarbonate, polyimide or an acrylic). Deposit a photoresist layer R3 by one of various means, such as spinning, dip-coating or laminating, and then configured by masked exposure and developing. This provides a half-round channel 82, which may be mirrorized if desired.

Step 2. Deposit the waveguiding layer A (83). The waveguiding layer A typically is another polymer, such as cycloolefincopolymer, or a glass-polymer composite, such as ormosil.

Steps 3 & 4—Expose & Develop Resist Pattern for Waveguide Pattern

Step 3. Apply a thick photoresist layer on top of layer 83. Pattern-expose the thick photoresist layer to leave a strip 84, using a large-area projection lithography system. The pattern may include the waveguide channels and pairs of 45° facets for 90° bends, but the emphasis here is on the connection to a round optical fiber.

Step 4. The opened portion of the layer R3, recently vacated by the removed portion of waveguide layer 83, and air, which has the appropriate reflectivity for TIR, results in a ridge-type waveguide extending to the edge of the element. Polishing the end exposes rounded waveguide 85 with an end 86 squared for a butt joint with a rounded optical fiber.

Step 5—Overcoat to form Channel Waveguide

Step 5. Add layer B (87), with TIR reflectivity, to convert the ridge-type waveguide of Step 4 to a channel-type waveguide. Polish for a flat face ready for a butt joint with a rounded optical fiber.

Wall Profiles Note that the wall profiles of the waveguide and the bend facet depend on the resist and its processing. A suitable resist that may be applied in thick layers and produces vertical profiles is SU-8.

Key Optical Requirements

The overcoat polymer B may be the same as the underlayer C, or it may be a different material, determined by various processing considerations, such as adhesion, thermal characteristics, chemical properties, etc. Clearly, the key optical requirement is that nC<nA>nB. Note that the bending of the optical rays travelling in the waveguide takes place by total internal reflection.

Review of Total Internal Reflection (TIR) and Materials

The waveguide material differs in refractive index from the underlayer material and overcoat material, which may be the same material C, or may be of differing materials, so long as the TIR relationships ($n^C<n^A>n^B$) are maintained. Differences in refractive index (n) may occur naturally when different materials are used, but the relationships must be maintained. Preferred materials are:

Underlayer—Polycarbonate, polyimide, or an acrylic resin

Waveguiding layer—cyclo-olefin copolymer, or a glass-polymer composite such as ormosil Overlayer—(May be same as Underlayer or other, depending on desired properties of adhesion, thermal properties and chemical properties.

Refractive Index Modulation (Photobleaching)

It is possible to produce the required refractive index differential, required for waveguiding by TIR, by refractive index modulation of a single material. Such modulation is possible by a process called "photobleaching" in which the non-waveguiding regions are unmasked and formed by radiation.

Conclusion

The invention has been shown and described with respect to a TIR embodiment and other embodiments to form ridge-type or channel-type waveguides. TIR has been occasioned selectively by material-choice change at an optical interface or by material-phase change at the optical interface. It will be obvious to those skilled in the art that additional changes may be made to achieve in-plane waveguiding, without departing from the spirit and scope of the invention.

Process

PROCESS EMBODIMENT 1

Fabrication of Channel Waveguides with TIR In-Plane Mirrors

This process produces 45° facets in channel waveguides. FIG. 3 shows the sequence of steps for this process. On a suitable substrate or underlayer 11 made of material C (such as polycarbonate, polyimide or an acrylic), first the waveguiding (waveguide) layer 12 made of material A is applied by one of various means, such as spinning, dip-coating or laminating. Material A may be another polymer, such as cycloolefincopolymer, or a glass-polymer composite, such as ormosil. A thick photoresist layer 13 of material R1 is applied on top of the waveguide layer. The resist is patterned using a large-area projection lithography system such as has been described in various publications by scientists at Anvik Corporation. The pattern 14 includes the waveguide channels and a 45° facet for a 90° bend. After exposure, the non-waveguide regions of the photoresist are developed away and an etching step then transfers this pattern into the waveguiding layer 12, forming a ridge-type waveguide 15. Suitable etching techniques include RIE and high-density plasma etching. The etch is stopped at the interface between layers 12 and 11, using a standard etch stop method as monitoring of the etching plasma for emission of characteristic constituents or dopants in material A or C. Alternatively, the waveguide can be formed directly, without the need for photoresist, by direct photoablation of the non-waveguide regions of waveguiding layer 12.

Note that the wall profiles of the waveguide and the bend facet depend on the resist and its processing. A suitable resist that may be applied in thick layers and produces vertical profiles is SU-8; an example of vertical features produced in 70 μm thick SU-8 using a large-area lithography system is shown in FIG. 15. The structure thus formed may be used as is in ridge waveguide form, or it may be overcoated with another layer 16 made of material B to produce a channel waveguide. The overcoat material B may be the same as the underlayer C, or it may be a different material, determined by various processing considerations, such as adhesion, thermal characteristics, chemical properties, etc. Often, material B will be a polymer. The key optical requirement for waveguiding is that $n_C < n_A > n_B$. The need for total internal reflection at an angle of incidence of 45° requires a relatively large index of refraction differential between $n_A$ and $n_B$. The ratio of $n_A/n_B$ must be greater than 1.414.

The use of an underlayer material C on top of a different substrate material D allows $n_C$ to be relatively low and satisfy $n_C < n_A$ while at the same time making it possible to use a substrate material D with a high index of refraction. Such high index of refraction substrates can have advantageous properties in term of mechanical strength and temperature tolerance.

PROCESS EMBODIMENT 2

Fabrication of Channel Waveguide with Metallized In-Plane Mirrors

FIG. 4 illustrates a process which produces metallized 45° mirrors in channel waveguides. First a suitable underlayer 11 of material C is applied followed by a layer 12 of the waveguiding material A, as in Process 1. A photoresist layer 23 of material R1 is then applied in which a rectangular well 24 is patterned and developed away. An etching step then transfers this well into the layer 12 to form deeper well 25. As in Process Embodiment 1, suitable etching techniques include reactive ion etching (RIE) and high-density plasma etching. The etch is stopped at the interface with layer 11 using standard etch stop methods as described above. This is followed by metal (e.g., Al) deposition 26 on the walls of the well, after which the resist 23 is stripped. This removes all of the metal that was deposited on top of the photoresist layer as well as the metal that was deposited along the sides of the well that was in contact with the photoresist, leaving the well structure 27 with metal walls. Deposition of the metal on the walls can be accomplished by arranging the angle of deposition to be at an acute angle θ with respect to the surface of the substrate and then rotating the substrate around the surface normal during deposition. In order to prevent shadowing, the width w of the well must be large enough so that w > d/tan θ, where d is the depth of the well.

Next, a new resist layer 28 of planarizing photoresist material R2 is applied on the whole substrate and as before, patterned using a large-area projection lithography system to produce a photoresist pattern 29 that defines the waveguiding channels and the 45° facet, leaving only the waveguiding regions resist-coated. In order to enhance the protection of the metal in various areas where it is desired that the metal remain after subsequent etching processes, it is sometimes desirable for the pattern 29 to have a slight overhang. The non-waveguiding regions, including the metal coated well walls other than the 45° facet 30, are removed by a directional etching step. The etch is stopped at the interface with layer 11 in the manner using standard etch stop methods as described above. Stripping of the resist then results in ridge waveguides 31 of polymer material A. Alternatively, the waveguide can be formed directly, without the need for photoresist, by direct photoablation of the non-waveguiding regions of waveguide layer 12.

The sample is then coated with the polymer material B to form the overcoat layer. Here the reflection at the 45° facet is enabled by the metallized facet 30; therefore there is a greater flexibility in the choice of the polymer material B since total internal reflection is not required at this interface. The differential between $n_A$ and $n_B$ can now be as small as required for good waveguiding, on the order of 0.10. Note that as for Process Embodfiment 1, the different lithographic patterning steps require suitable depth of focus (to accommodate possible aplanarity of the non-rigid layers) and layer-to-layer alignment (for registration of the mirror facet); the large-area lithography technology. The seamless large-area lithographic techniques described by scientists at Anvik Corporation are is ideally suited for both these requirements.

PROCESS EMBODIMENT 3

Fabrication of Channel Waveguides with Metallized In-Plane Mirrors by Photobleaching This process produces channel waveguides by inducing a refractive index differential between the waveguide and the non-guiding regions through photobleaching. As shown in FIG. 5, the steps up to the formation of the well with metallized walls are the same as in Process Embodiment 2.

Then, a new resist layer 35 of material R3 is next applied and patterned so that all non-waveguiding regions are opened and the desired metallized wall region is protected. The resist material R3 is chosen so that it both an effective barrier to the subsequent etch step and so that it is opaque to the photobleaching radiation. The sample is now subjected to a directional etching process that removes the unwanted metal, leaving the desired metal facet 30. Next, the sample is uniformly irradiated with appropriate exposure of the photobleaching radiation so that the index of the exposed regions 37 made of modified material A" becomes slightly lower than the unexposed regions. The resist is then stripped and an overcoat 38 of polymer B is applied, thus forming the desired embedded waveguides. The index of refraction condition that must be satisfied is $n_C < n_A > n_{A''}$, $n_B$.

Alternatively, the exposure to the photobleaching radiation could be accomplished by projection through a mask. In this case the waveguides are directly produced and the step involving patterning of resist layer R3 to define the waveguides is not needed. R3 is needed only to protect the desired metal facet 30 and should be patterned accordingly.

The photobleaching phenomenon in polymers is well known and an extensive literature exists on this subject. This information guides the selection of materials and photobleaching wavelengths.

PROCESS EMBODIMENT 4

Fabrication of Channel Waveguides with Out-of-Plane Bends and Mirrors

This process produces channel waveguides with sharp out-of-plane bends and mirrors and is illustrated in FIG. 6. On the underlayer 11 made of material C, a photoresist layer 41 of material R is applied whose thickness is made a few microns greater than the height of the waveguide to be formed. It is patterned to form an isolated wall 42 with highly sloping sides. The cross-section profile of such a resist pattern will have rounded top and bottom ends, with a nearly straight, large section in the middle. The resist is hardened by baking. Note that such patterns are easy to produce in conventional projection lithography, and on large areas with appropriate large area lithography technology.

The resist structure is next coated with a layer 43 of metallic material M. A second underlayer 44 of material C' is then applied to a thickness sufficient to submerge the rounded bottom of the resist profile. Material C' can be the same material as material C or a different underlayment material that obeys the condition $n_{c'} < n_A$. In the case where the layer 44 is not thick enough to prevent loss of light due to evanescent coupling from the waveguide area to the underlying film 43 of material M, an additional patterning step. Note the discontinuous layer 43' shown in the inset in FIG. 7(v). Trimming can be performed to remove the metal from all regions except the desired facet area. Now the waveguiding layer 45 of material A is coated to the desired thickness, which is such that its top surface stops short of the upper rounded end of the resist height. It can be further laterally patterned (not shown in the Figure) to form a channel waveguide. This is followed by deposition of the top layer 46 of material B, completing the process of forming a 90° sharp bend that is capable of sending a light signal 47 from the waveguide vertically out of the plane, e.g., into a detector (or from a source into the waveguide).

PROCESS EMBODIMENT 5

Fabrication of Optical Via Coupled with a Single Bend

This process produces an optical via that is coupled with a single bend to a channel waveguide. An optical via is a vertical channel in a non-waveguiding material for an optical signal to travel without spreading from diffraction from an embedded horizontal waveguide to a location in a different horizontal plane or to a location on the surface of the photonic-electronic circuit board. Clearly, to be useful, an optical via is combined with one or two 90° out-of-plane sharp corner bends, so that an optical signal can be transported between a waveguide and a detector or a source, or between two waveguide layers.

The process is illustrated in FIG. 7. The steps leading up to forming an out-of-plane mirror are the same as in Process Embodiment 4. As shown in FIG. 7(vi), after deposition of the waveguide layer 45 made of material A, a thick layer 51 of a photoresist is applied, which is then patterned to produce a pillar 52 where the optical via is desired to be formed. Now the upper layer 53 made of material B (which also serves as the isolation layer between two waveguiding layers) is applied, followed by stripping of the resist, which creates a hollow vertical channel. The channel is then filled with the waveguide material A, creating the desired structure 54, as shown in FIG. 7(viii)

PROCESS EMBODIMENT 6

Fabrication of Optical Via Coupled with Two Bends

This process embodiment produces an optical via that is coupled with two 90° corner bends to connect two channel waveguides in different horizontal planes that are displaced vertically. Additional process steps are required, but they are a logical extension of the methodology described above. After the optical via is fabricated according the steps of Process 5, the sample is coated with a third underlayer 71 of material C'" as shown in FIG. 8(ii). Material C'" can be the same material as material C or material C' or it can be a different underlayment material that obeys the condition $n_{C'''} < n_A$. As in Process Embodiment 5, the layer 71 is patterned to produce a hollow vertical channel that is filled with waveguide material A, creating a vertical waveguide extension 72 that passes through layer 71. The sample is coated with a layer 73 of the waveguiding material A, a top coating 74 of material B and then a layer 62 of a photoresist made of material R. As shown in FIG. 8, the thick resist is patterned as in Process Embodiment 4 to produce a taper whose face 63 is mostly planar but has rounded top and bottom corners. Next an etching step as in Process 4 is used to transfer the slope into layers 71, 73, and 74. The curved sections of the transferred slope are in layers 71 and 74, while the optically active facet 75 that reflects the light from the vertical optical via into the top channel waveguide is composed of the planar section of the slope. The resist 62 is then stripped and a coating layer 76 of material B is applied to produce the finished structure—an optical via with two 90° mirror bends that is capable of transferring an optical signal 66 from one waveguide to another waveguide in a different plane. Note that the top mirror formed in this process sequence is a TIR mirror; if a metallized mirror is desired, a metallization step may be done after the after formation of facet 75. The stripping of resist 62 will then serve to remove metal from unwanted areas.

PROCESS EMBODIMENT 7

Fabrication of Waveguides with Optimized Cross-Section for Efficient Coupling to Fibers This process produces planar optical waveguides with nearly circular cross-sections using large-area lithography technologies. In some implementations of the photonic printed circuit board, coupling to fibers will be desirable. Coupling between circular fibers and waveguides with square or rectangular cross-sections is inherently non-optimum due to geometric mismatch. FIG. 9 shows the sequence of steps for this process. First a layer 81 of low-contrast resist material R3 is patterned to produce profiles with rounded walls 82. Note that such profiles are readily produced in projection lithography. Next, the waveguiding layer 83 of material A is applied, on which an etch stop layer 84 is coated and an etch stop is patterned. Layer 83 is now etched using a low-energy process that produces sloped walls 85 and rounded waveguide core 86. Finally, the overcoat layer 87 of material B is applied to cover the rounded waveguide 86. This is ready to receive the distal end of a round optical fiber in a low-loss light transmissive butt joint.

The invention claimed is:

1. A photonic-electronic multiple-layer circuit package family having electrical intra-layer and electrical inter-layer interconnection means, optical intra-layer and optical inter-layer interconnection means, plus electrical and optical escape means, and including electronic and optical transducer means both intra-layer and inter-layer
characterized by:
an electrical interconnected pattern layer having a selected pattern for connectivity to operational elements, and having physical gaps appropriately positioned for optical vias; and
optical inter-layer interconnection via means positioned for unobstructed optical passage through intervening layers at said gaps in the electrical interconnect pattern.

2. A photonic-electronic multiple-layer circuit package family in which optical via gaps are arrayed in a standard matrix pattern having electrical intra-layer and electrical inter-layer interconnection means, optical intra-layer and optical inter-layer interconnection means, plus electrical and optical escape means, and including electronic and optical transducer means both intra-layer and inter-layer
characterized by:
an electrical interconnected pattern layer having a selected pattern for connectivity to operational elements, and having physical gaps appropriately positioned for optical vias; and
optical inter-layer interconnection via means, in which said optical via gaps are arrayed in a standard matrix pattern, positioned for unobstructed optical passage through intervening layers at said gaps in the electrical interconnect pattern.

3. A photonic-electronic multiple-layer circuit package family according to claim 2, in which said optical via gaps are arrayed in a selected pattern appropriate for a selected photonic-electronic configuration.

4. A photonic-electronic multiple-layer circuit package family having electrical intra-layer and electrical inter-layer interconnection means, optical intra-layer and optical inter-layer interconnection means, plus electronic and optical escape means, and including electronic and optical transducer means both intra-layer and inter-layer
characterized by:
an electrical interconnected pattern layer having a selected pattern for connectivity to operational elements, and having physical gaps appropriately positioned for optical vias; and
optical inter-layer interconnection via means, with embedded photonic bandgap devices, in which said optical via gaps are arrayed in a standard matrix pattern, positioned for unobstructed optical passage through intervening layers at said gaps in the electrical interconnect pattern.

5. A photonic-electronic multiple-layer circuit package according to claim 2, with embedded diffractive elemental modulators.

6. A photonic-electronic multiple-layer circuit package according to claim 2, with embedded diffractive elemental modulator devices.

7. A photonic-electronic multiple-layer circuit package according to claim 2, with at least one of the following optical devices included:
optical clock, optical transceiver, detector arrays, waveguides, splitters, taps, switches, filters, wavelength multiplexers, wavelength demultiplexers, interconnected by optical switching and routing means; and
interconnected electronic circuitry and power circuitry.

8. A photonic-electronic multiple-layer circuit package according to claim 1, with multiple layers aligned together further characterized in that
said multiple aligned layers are subject to alignment anomalies; and
said optical vias and said electrical vias are aligned with accommodation for such alignment anomalies and for noninterference.

9. A photonic-electronic multiple-layer circuit package according to claim 1, with integral rounded optical waveguides for low-loss connectivity to individually aligned rounded optical fibers.

10. A photonic-electronic multiple-layer circuit in which said integral rounded optical waveguides are produced by depositing and pattern-etching a thick layer of a first TIR-complementary photoresist over a first TIR-complementary base material, to form a TIR-complementary rounded-bottom half channel corresponding to the bottom half of an optical fiber to be connected; depositing an optical waveguide material over said photoresist and half channel to a thickness which, combined with the thickness of said first photoresist, approximates the diameter of the optical fiber to be connected; patterning a central channel mask of a second photoresist material over said optical waveguide material, centered above said half channel so that etching will result in rounding the top of the optical waveguide material; etching away said optical waveguide material down to said first photoresist, and removing said second photoresist, to leave a half-embedded half-exposed rounded waveguide approximating an optical fiber; and covering said photoresist layer and said rounded waveguide material with a TIR-complementary material, so as to complete the TIR encapsulation of said waveguide material and leave effectively rounded TIR waveguides ready for low-loss connection to rounded optical fibers.

11. A photonic-electronic multiple-layer printed circuit package according to claim 10, in which said integral rounded optical waveguides are half embedded in a thick layer of a photoresist over a first TIR-complementary base material, to form a rounded-bottom half channel corresponding to the bottom half of an optical fiber to be connected;
  an optical waveguide material over said half channel to a thickness which, combined with the thickness of said photoresist, approximates the diameter of the optical fiber to be connected,
  a TIR-complementary layer over said optical waveguide material, to leave a fully embedded rounded waveguide approximating in shape and dimension an optical fiber; covered with a TIR-complementary material, completing the encapsulation of said waveguide material and leaving effectively round waveguides ready for low-loss connection by butt joint to aligned flat ends of round optical fibers at a polished edge.

12. The method of making a photonic-electronic circuit package termination characterized as follows:
  Step 1 Deposit, pattern, and develop a photoresist layer to leave a slope-sided run of photoresist over a base;
  Step 2 Deposit waveguide material B filling said slope-sided run and over the remainder of said photoresist layer;
  Step 3 Deposit protective mask layer D, of width related to the diameter of the desired rounded cross-section of waveguide, over said waveguide run; and
  Step 4 Etch unwanted B down to layer A, leaving a waveguide run of material B of rounded cross-section, to approximate a ridge waveguide with rounded terminations.

13. The method of making a photonic-electronic circuit package termination according to claim 12, further characterized as follows:
  Step 5 Deposit overlayer C over said remaining waveguide run to approximate a channel waveguide with rounded terminations.

14. The method of claim 12, in which the waveguide resulting at Step 4 is further characterized by:
  Step 5. Apply photoresist layer, expose and develop a well at a selected angle transition;
  Step 6. Deposit metal on side walls of said well, and strip resist;
  Step 7. Apply photoresist layer R2, expose waveguide regions and etch all areas except waveguide regions, so that all non-waveguiding regions are exposed; and
  Step 8a. Photobleach optically transmissive material so as to be lower in refractive index from said waveguide layer (101) material, forming a channel type waveguide.

15. A photonic-electronic waveguide circuit board with off-board connective provision, for contacting to optical fibers having rounded cross-section of a selected diameter, characterized by:
  a photonic printed circuit fabricated by the methods of claim 13, in which a selected portion of the waveguide pattern resulting at Step 4 is further characterized by rounded cross-section fabricated as follows:
  Step 5 Deposit overlayer C and grind the edge flat vertical, leaving a termination for a butt joint of round cross-section photonic printed circuit waveguide run with a flat distal end for accepting a mating flat distal end of a similar-dimensioned round optical fiber.

16. The method of making a photonic-electronic circuit package, in the following steps:
  Step 1 Provide a composite layer of waveguide-forming material (C 11) with a complementary waveguide-forming material (A12) and a layer of photoresist (R1 13);
  Step 2 Pattern and develop said photoresist layer (R1 13) into a turning pattern (14) for a waveguide layer (12);
  Step 3 Remove sacrificial portion of waveguide layer (12) to leave patterned waveguide (15);
  Step 4 Coat with -overlayer (B 16) to leave a channel waveguide with a turning mirror right angle effectuated by total internal reflection.

17. The method of making a photonic-electronic circuit package, in the following steps:
  Step 1 Provide a composite layer of waveguide-forming material (C 11) with a complementary waveguide-forming material (A12) and a layer of photoresist (R1 13);
  Step 2 Image and develop to form a rectangular well (24) appropriately placed and angled for a turning mirror;
  Step 3 Etch to transfer the well into the layer (A 12) to complete the well opening (25) stopping at the base layer (C 11);
  Step 4 Metallize with a mirror layer (26) on walls of the well;
  Step 5 Strip resist (R1 23), leaving mirrorized wall (27) in the well;
  Step 6 Apply planarizing photoresist layer (R2 28), expose waveguide regions and etch all areas except waveguide regions, so that all non-waveguiding regions and desired mirror (30) are exposed, forming a ridge waveguide.

18. The method of making a photonic-electronic circuit package according to claim 17, further characterized by
  the planarizing photoresist (R2 29) is patterned with a small overhang to protect the mirror layer (30) under the overhang.

19. The method of making a photonic-electronic circuit package according to claim 17, further characterized by
  Step 7 Coat with a complementary TIR waveguide-forming layer (B 38) of lower refractive from said waveguide layer material, forming a channel-type waveguide of total internal reflection, except at metallized mirror facet transitions, to convert from ridge waveguide to channel waveguide.

20. The method of making a photonic-electronic circuit package according to claim 17, further characterized by:
  Step 7. Photobleach optically transmissive material so as to be lower in refractive index from said waveguide layer (A 12) material, forming a channel type waveguide.

21. The method of making a photonic circuit package according to claim 17, further characterized by
  the planarizing photoresist (R2 29) is patterned with a small overhang to protect the mirror layer (30) under the overhang.

22. The method of making a photonic circuit package according to claim 17, further characterized by substitution of direct photoablation for photoresist techniques in making the non-waveguiding regions of said waveguide layer (12).

23. The method of making a photonic-electronic circuit package, in the following steps:
  Step 1 Provide a composite layer of waveguide-forming material (C 11) with a layer of photoresist (R 41);
  Step 2 Image and develop to form a pillar (42) appropriately placed and angled for a turning mirror, but having a set of undesired.curves as well as a desired mirror base portion;
  Step 3 Develop and bake to cure said pillar (42);

Step 4 Metallize with a mirror layer (43) on said pillar;

Step 5 Deposit underlayer (44) to cover at least one of said undesired curves of said pedestal (42); and Step 6 Apply waveguide material layer over said underlayer, so that the waveguiding region addresses said desired mirror base portion of said pedestal (42); leaving a vertical light beam exit perpendicular to said waveguide material layer.

24. The method of making a photonic-electronic circuit package, according to claim 23, further characterized in that said mirror layer is removed to be discontinuous just outside said waveguide layer under said underlayer (44).

25. The method of making a photonic-electronic circuit package, according to claim 23, further characterized in that said mirror layer is removed to be discontinuous just outside said waveguide layer under both said underlayer (44) and said overcoat layer (B 46).

26. The method of making a photonic-electronic circuit package, according to claim 23, further characterized by the following steps:

Step 7 Deposit a thick photoresist layer over a top portion of said pedestal (42);

Step 8 Expose and develop a well (52);

Step 9 Fill said well (52) with waveguide material (54): and

Step 10 Coat all around said waveguide material (54) with a lower refractive index waveguide complementary TIR material (53) to provide an vertical optical exit via.

27. The method of making a photonic-electronic circuit package, according to claim 25, further characterized by the following steps:

Step 11 Coat with underlayer ( C" 71) of optical material that obeys the condition $n_{C''} < n_{A''}$, pattern a gap and fill with waveguide material (A 72) as an extension vertical waveguide;

Step 12 Coat with waveguide material (A 73) and a top coating of material (B 74) and a thick layer of resist (R 62);

Step 13 Pattern and develop said thick layer of resist (R 62) with clearance past said vertical waveguide extension (72):

Step 14 Etch to transfer the slope into layers (71, 73 and 74) down to the leave of said vertical waveguide (54) and remove resist (R 62); and Step 15 Coat with TIR waveguide-complementary material (B 76), resulting in a vertical optical via turning into a horizontal optical waveguide in a parallel layer.

* * * * *